United States Patent [19]

Gaskill et al.

[11] Patent Number: 5,136,719
[45] Date of Patent: Aug. 4, 1992

[54] AUTOMATIC ANTENNA TUBING METHOD AND APPARATUS

[75] Inventors: Garold B. Gaskill, Tualatin; Larry H. Mukai, Aloha, both of Oreg.

[73] Assignees: Seiko Corp.; Seiko Epson Corp., both of Tokyo, Japan

[21] Appl. No.: 279,952

[22] Filed: Dec. 5, 1988

[51] Int. Cl.⁵ .............................. H04B 1/18
[52] U.S. Cl. .................... 455/193.1; 455/121; 455/134; 455/154.1; 455/169.1; 455/195.1; 455/260; 340/311.1; 340/825.44
[58] Field of Search ............... 455/193, 274, 226, 260, 455/344, 195, 173, 187, 121, 154, 169, 120, 134, 150, 151; 340/825.44, 825.45, 825.46, 825.47, 311.1

[56] References Cited

U.S. PATENT DOCUMENTS

| | | | |
|---|---|---|---|
| 3,519,939 | 7/1970 | Tashima | 455/193 |
| 3,600,684 | 8/1971 | Cherry | 455/193 |
| 4,381,566 | 4/1983 | Kane | 455/193 |
| 4,450,588 | 5/1984 | Röhrich et al. | 455/193 |
| 4,710,973 | 12/1987 | Suzuki | 455/195 |
| 4,713,631 | 12/1987 | Enderby et al. | 455/195 |
| 4,789,866 | 12/1988 | Ohe et al. | 455/193 |
| 4,817,196 | 3/1989 | Macnak et al. | 455/193 |
| 4,837,852 | 6/1989 | Takada et al. | 455/193 |
| 4,862,516 | 8/1989 | Macnak et al. | 455/195 |
| 4,885,802 | 12/1989 | Ragan | 455/344 |
| 4,921,465 | 5/1990 | Hietala et al. | 455/193 |

Primary Examiner—Donnie L. Crosland
Attorney, Agent, or Firm—Elmer Galbi

[57] ABSTRACT

A wristwatch paging receiver is provided with an antenna matching network that automatically retunes the network at the beginning of a listening interval. During the retuning operation, a control signal is applied to a variable tuning element in the matching network, such as a varactor diode, and is swept from a minimum value to a maximum value. This sweeping is desirably performed in discrete voltage steps that correspond to unit increments of varactor capacitance. A feedback signal from the receiver, such as an AGC signal, is monitored during this operation to note which varactor bias signal yields the maximum AGC signal. After the sweep is concluded, the apparatus applies to the varactor the bias voltage that yielded the maximum AGC signal during the sweeping operation. This bias voltage is maintained through the end of the listening interval. At the beginning of the next listening interval, the process may be repeated.

17 Claims, 1 Drawing Sheet

AUTOMATIC ANTENNA TUBING METHOD AND APPARATUS

FIELD OF THE INVENTION

The present invention relates to radio receivers and their antennas, and more particularly to a method and apparatus for automatically tuning an antenna in a receiver which operates on a time division multiplexed basis.

BACKGROUND OF THE INVENTION

Wristwatch paging receivers are known in the art, as illustrated by U.S. Pat. No. 4,713,808 to Gaskill et al. Such receivers often use antennas that are disposed in a band looped around the user's wrist or neck. The impedance of such an antenna is strongly dependent on many factors, including the band's length, its degree of parasitic coupling to the user's body and other objects, and the frequency at which it is operated.

Wristband antennas are relatively small in terms of wavelength and may have a relatively high Q. Even a slight change in any of the above-referenced factors can result in a large change in tuned frequency. Furthermore, their small size provides a correspondingly small signal to the attached receiver. It is important that a tuning/impedance matching circuit be provided to match and tune the antenna to the receiver to insure optimum power transfer therebetween.

WIPO patent publication 88/05213 discloses a wristwatch receiver embodying a variable matching circuit. In the disclosed system, the matching circuit includes a variable capacitor that can be accessed by opening a cover element. Once exposed, the circuit can be tuned with a screwdriver. The WIPO disclosure proposes adjusting the capacitor by using an auxilary RF signal generator located near the receiver to radiate a signal at the desired reception frequency. The receiver displays the relative strength of the received signal on an LCD display positioned beneath the removable cover. With the RF signal generator activated, the user can adjust the variable matching capacitor until the display indicates that a maximum signal is being received.

The tuning procedure for the system disclosed in this WIPO publication requires manual intervention. It requires that a cover be removed from the watch and a microminiature capacitor be adjusted with a screwdriver. The receiver may become detuned as soon as it is moved, whether off the user's wrist or simply towards or away from the user's body. Each such movement changes the antenna's parasitic coupling to the surrounding materials and thereby changes its resonant frequency which requires that the tuning process be repeated.

A related WIPO publication, 88/05214, discloses a second wristwatch receiver embodying a variable tuning circuit. In this second system, an automatic tuning circuit within the wristwatch receiver is activated in response to reception of a tuning mode signal on the frequency being received. This tuning mode signal can be part of the system synchronization signal, an independent selective call signal decodable by an entire group of receivers, or a secondary signal decoded after a receiver's individual selective call address has been decoded. The tuning operation can also be manually initiated by a user operable switch.

Tuning is effected by a varactor tuning element that is controllably biased by a microcomputer through a D/A converter. The bias voltage is increased, apparently in uniform steps, until a drop is noted in the level of the received signal. The bias voltage that was applied immediately preceding this drop is then selected as the proper tune voltage.

The magnitude of the received signal in this second system is determined by comparing it against four discrete analog levels. If, in a given situation, all of the levels are exceeded, the apparatus must reduce the gain of the receiver until the received signal falls between the minimum and maximum comparison levels. Similarly, if the received signal is below all four levels, the apparatus must increase the gain of the receiver. This arrangement slows the tuning operation and renders the tuning system inoperative in areas of very high or low signal strength, where the receiver cannot bring the received signal within the range of the comparison levels.

Another characteristic of this system is its presumption that the received signal strength will only have one local maximum as the varactor bias voltage is increased. Consequently, as soon as a drop in received signal is noted, the system concludes that the optimum tuning condition has been determined. More likely, the received signal will have several local maxima, many of them spurious due to unpredictable effects such as noise and movement of the antenna during the tuning operation.

This second system requires that a tuning command signal be transmitted with the paging signals. The disclosure specifies that an unmodulated carrier should be transmitted for approximately 200 milliseconds following the command signal to permit the tuning apparatus to tune. This requires a redesigning of the paging protocol and uses time that could otherwise be used for message transmission. The more often the tuning command signal is transmitted, the more time is diverted from message transmission.

If a receiver according to this second WIPO disclosure is moved between tuning intervals, it may be operated in an untuned state until another tune command is received. A receiver operated in an untuned state may miss a message.

It is an object of the present invention to provide an improved automatic tuning apparatus for a radio receiver.

It is a more particular object of the present invention to tune a matching network in a wristwatch receiver periodically, such as at the beginning of every reception slot for which the receiver is energized.

It is another more particular object of the present invention to tune a matching network in a wristwatch receiver over its entire range before concluding which tuning condition is optimum.

It is still another more particular object of the present invention to increment the bias voltage applied to a varactor tuning element in steps that correspond to unit increments of capacitance, rather than unit increments of voltage.

It is yet another more particular object of the present invention to phase-lock to a clock signal broadcast with paging data simultaneously with the automatic tuning of an antenna matching network.

BRIEF DESCRIPTION OF THE INVENTION

The present invention provides a method and apparatus for automatically tuning a radio antenna in a radio receiver which is periodically activated to receive packets of information. With the present invention, the antenna is automatically tuned on a periodic basis prior to the receipt of a packet of information.

A tuning element is connected to the antenna and during each tuning operation the antenna is swept across an entire tuning range to an optimum level. While the antenna is swept across this entire range, a Received Signal Strength Indicator (RSSI) signal is monitored to detect the value of the tuning element that produces the maximum RSSI signal. After the sweep is concluded, the system sets the tuning element, and hence the antenna, to the value that produced the maximum RSSI signal. The packet of information is then received and passed for further processing to a protocol decoder to decode the information.

The foregoing and additional objects, features and advantages of the present invention will be more readily apparent from the following detailed description, which proceeds with reference to the accompanying drawings.

DETAILED DESCRIPTION

Figure 1:
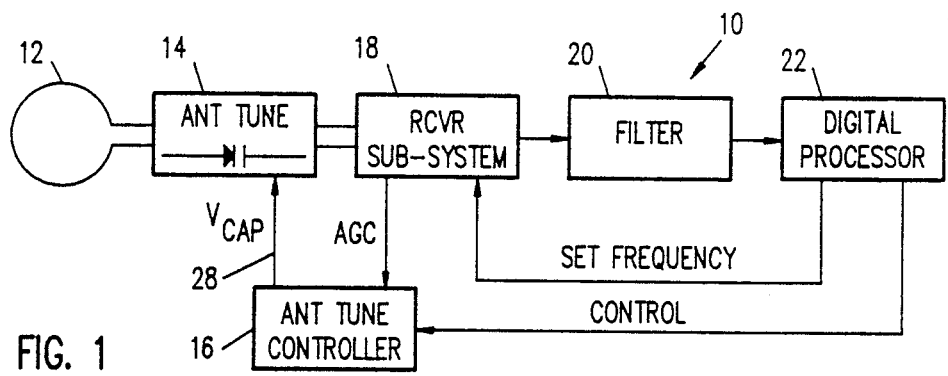
FIG. 1 is a block diagram of wristwatch receiver according to the present invention.

Referring to FIG. 1, a wristwatch paging receiver 10 according to the present invention may include an antenna 12, an antenna tuning circuit 14, an antenna tuning control circuit 16, a receiver subsystem 18, a filtering section 20 and a digital control processor 22. The antenna 12 receives radio frequency signals in the desired reception band, such as 88 to 108 megahertz, and couples them, through the antenna tuning circuit 14, to the receiver subsystem 18. The antenna tuning circuit 14 resonates the antenna and matches the tuned circuit to the input impedance of the receiver subsystem (100 ohms in the illustrated system) so as to provide optimum power transfer to the receiver. The antenna tuning circuit 14 is controlled by the antenna tuning control circuit 16, as described in greater detail below.

The receiver subsystem 18 processes the RF signals from the antenna 12 and produces baseband output signals corresponding to a desired FM signal within the reception band—typically an FM signal carrying the paging data on an SCA subcarrier thereof. The receiver subsystem includes an RF amplifier, a synthesized local oscillator (controlled by the digital control processor 22), a mixer, associated IF amplification stages and a detector. Exemplary receiver subsystems are disclosed in the above-reference Gaskill et al patent and in copending application Ser. No. 07/213,719, filed Jun. 30, 1988 and assigned to the present assignee, both of which disclosures are incorporated herein by reference.

The filtering section 20 of apparatus 10 includes a phase locked loop that locks to a 19 kilohertz pilot of the SCA subcarrier and provides data synchronized to this pilot signal to a digital filter. The digital filter attenuates the entertainment programming portions of the baseband FM signal and provides the filtered data signal to the digital processor 22. The digital processor uses this data to control the user interface of the paging receiver.

In the illustrated embodiment, the receiver is activated for only a 35 millisecond interval every 1.875 minutes. The receiver is deenergized during the remainder of the 1.875 minute interval to conserve battery power.

Figure 2:
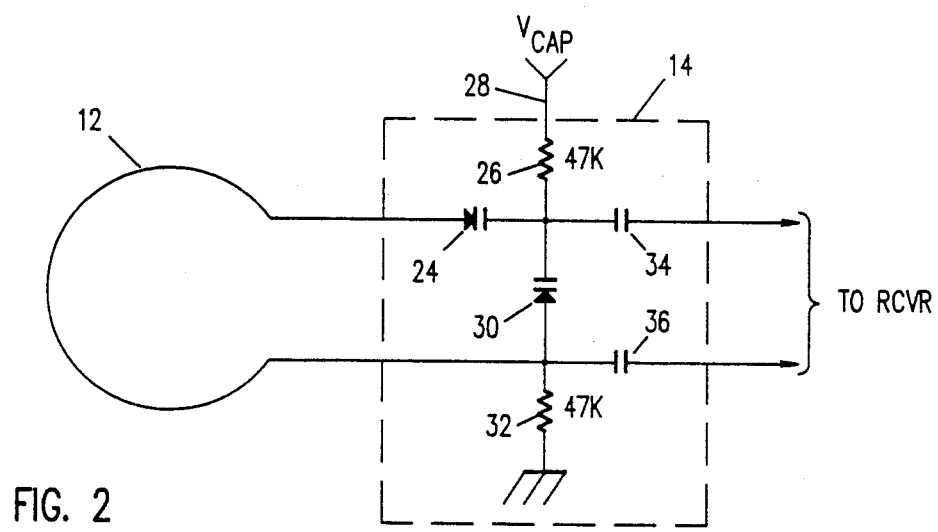
FIG. 2 is a schematic diagram of a varactor antenna tuning circuit that may be used in the receiver of FIG. 1.
Figure 3:
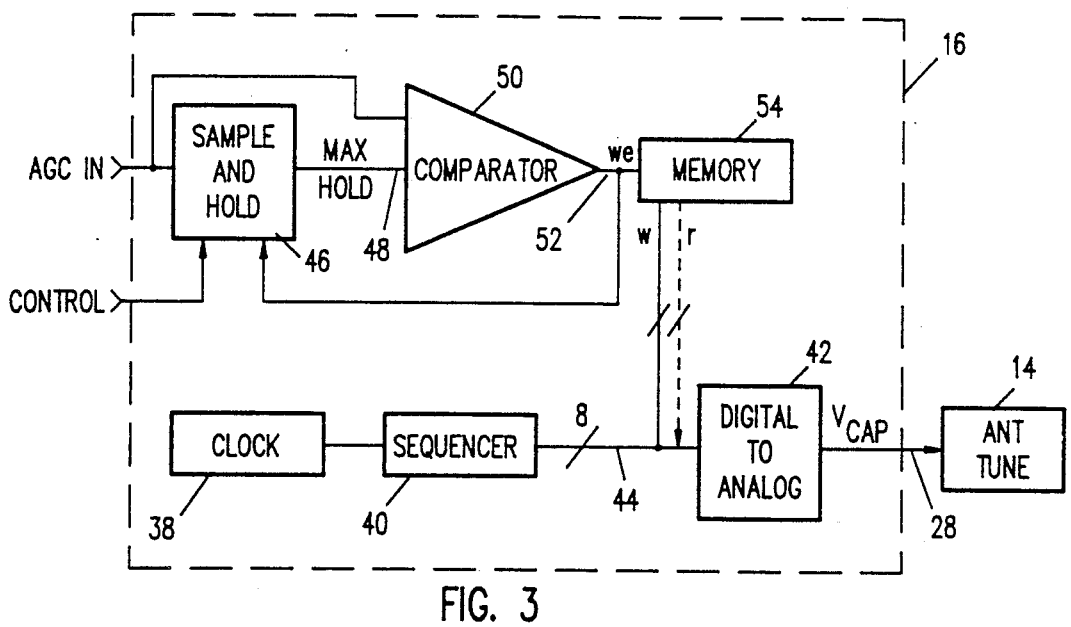
FIG. 3 is a block diagram of an antenna tuning control circuit that may be used in the receiver of FIG. 1.

FIGS. 2 and 3 show the antenna tuning circuit and the control circuit therefor. The tuning circuit, shown in FIG. 2, is straightforward. The loop antenna 12 is coupled at a first end to the anode of a first varactor diode 24. The cathode of this diode is biased through a 47 kilohm resistor 26 from a $V_{cap}$ line 28, described in detail below, and is connected to the cathode of a second varactor diode 30. (The first and second varactor diodes 24, 30 used in the illustrated embodiment each present a capacitance that varies from about 15 to 45 picofarads as the bias voltage is varied from 0 to 4 volts.) The anode of the second varactor is connected to the second end of the loop antenna and is coupled to ground through a second 47 kilohm biasing resistor 32. The output of the tuning circuit is taken across the second varactor diode and is capacitively coupled, through capacitors 34 and 36, to the antenna input port of the receiver subsystem 18.

The circuit 16 used to control the varactor biasing voltage is shown in FIG. 3. This circuit has two operational modes. In the first mode, termed the tuning mode, the circuit determines the varactor bias voltage that yields the greatest received signal strength. In the second mode, termed the listening mode, the circuit provides to the varactors the bias voltage earlier determined to be optimum.

In the tuning mode, the control circuit 16 sweeps the varactor biasing voltage over its full range and determines which bias voltage yields the maximum received signal strength. The sweeping is accomplished by a clock 38, a sequencer 40 and a digital-to-analog (D/A) converter 42. Clock 38, which may operate for example at 25 kilohertz, steps the sequencer 40 through a plurality of states. In the illustrated embodiment, the sequencer may have 100 states, each one providing a successively larger 8 bit 5 binary output signal to an 8-bit bus 44 and thence to the D/A converter 42. (The sequencer 40 can be implemented as a 100 entry ROM look-up table that is addressed by a binary counter incremented by the clock.) The D/A converter converts the binary outputs from the sequencer into analog voltages, ranging from 0 volts (corresponding to a sequencer output of '00000000') to 4 volts (corresponding to a sequencer output of '11111111'). The output from the D/A converter 42 is fed to the varactors 24, 30 in the antenna matching circuit 14 and causes that circuit to tune through its full range.

To determine the optimum tuning condition, the control circuit 16 receives from the receiver subsystem 18 a Received Signal Strength Indicator (RSSI) signal which is indicative of received signal strength. An AGC signal is one example of a signal that can be used as the RSSI signal. The RSSI signal is applied to the input of an analog sample and hold circuit 46 and to one input of an analog comparator 50. The second input of the comparator is driven from a Max. Hold output line 48 of the sample and hold circuit 46. These circuits cooperate to detect the optimum timing condition and store in a memory 54 the sequencer output that yielded that condition.

The sample and hold circuit 46 receives a control signal from the digital processor 22 at the beginning of each listening interval which causes the signal on the Max. Hold output line 48 to be reset to zero. (Although not shown for clarity of illustration, control signals are also applied from the processor 22 to the other components in the antenna tune controller 16 to bring them up in the desired state on power-up and to control and sequence their subsequent operation.)

The comparator 50 operates by examining the two signals applied to its inputs and producing an output signal on line 52 whenever the signal on the Max. Hold line 48 is exceeded by the signal on the RSSI (AGC) line. Since the Max. Hold line 48 is reset to zero on power-up, the first RSSI signal applied to the comparator produces an output signal on line 52. This signal causes the sample and hold circuit 46 to sample to RSSI signal and to hold that signal on the Max. Hold line 48. The comparator output signal also controls a write enable input of an 8-bit memory stage 54 and causes the 8-bit word then present on the bus 44 to be latched into the memory. After the Max. Hold line 48 is updated with the just-sampled signal, the two signals applied to the comparator 50 are made equal and its output signal on line 52 terminates.

Each time a new maximum RSSI signal is reached, the above-described cycle repeats. The RSSI input to the comparator 50 momentarily exceeds the signal on the Max. Hold line (until the sample and hold circuit samples and applies the new maximum voltage to that line) and causes the output of the comparator 50 to produce another output signal on line 52. This signal again latches the 8-bit word then present on the bus 44 into the memory. Thus, each time a new maximum in the RSSI signal occurs, the corresponding binary signal on bus 44 that prompted it is stored in the memory.

After the sequencer 40 has cycled through all of its 100 states, circuitry responsive to the 100th state switches the control circuit 16 to its listening mode. In this mode, the eight bits stored in memory 54 are read from the memory and applied to bus 62 and thereby to the input of the D/A converter 42. The D/A converter converts this eight bit word to the analog varactor bias voltage that yielded the maximum RSSI signal during the sweeping operation. This voltage is applied to the varactors until the listening interval terminates.

In the illustrated embodiment, the tuning mode lasts approximately 4.2 milliseconds. (40 microseconds per step times 100 steps yields 4 milliseconds, with an additional 0.2 milliseconds for circuit settling and switching.) At the conclusion of this interval, the optimum varactor bias voltage is known and is thereafter applied to the varactors for the remainder of the 35 millisecond listening interval.

As noted, the illustrated sequencer 40 cycles through 100 states during the tuning mode. Consequently, the varactors 24, 30 are biased with 100 different voltages. The limit on the number of discrete bias voltages that may be tried is determined by the time interval within which the tuning operation must be completed and the time delay in the RSSI feedback loop. In the illustrated embodiment, in which the tuning operation is completed in 4.2 milliseconds, each discrete varactor voltage is only applied for 40 microseconds. If the varactor is advanced from one bias voltage to the next more quickly than this, the sequencer 40 will have already advanced to its next state before the RSSI comparison resulting from the previous state has been completed.

(Of course, circuitry could be provided to store the immediately preceding 8-bit word from the sequencer in the memory 54 whenever a new maximum RSSI signal is detected, so as to compensate for the feedback loop delay. However, in the interest of simplifying the circuitry, the preferred embodiment is designed to work within the constraints imposed by this delay.)

In prior art systems employing digitally controlled varactors, such as in the above-referenced second WIPO disclosure, the varactors are typically stepped through uniform voltage steps. However, the voltage-to-capacitance relationship of a varactor is non-linear, so that the change in capacitance achieved by increasing the bias voltage from 0.0 to 0.1 volts is markedly greater than the change in capacitance achieved by increasing the bias voltage from 3.9 to 4.0 volts. Consequently, the varactors' tuning at low capacitance values is substantially more 'coarse' than that achieved at high capacitance values.

To overcome this deficiency, the sequencer 40 employed in the present invention does not sequence between 100 equally spaced binary outputs. Rather, the successive binary outputs are spaced at successively greater intervals as the sequence proceeds. Thus, instead of advancing uniformly from 0 volts to 4 volts in steps of 0.04 volts (i.e. 4.0 v./100), the states of the sequencer correspond to those required to increase the capacitance of the varactors uniformly from 15 picofarads to 45 picofarads in steps of 0.3 picofarads (i.e 30 pf/100).

If desired, an additional correction can similarly be made to linearize the varactor tuning as a function of frequency. The frequency to which the matching network is tuned is inversely related to the square root of the varactor capacitance. The 100 varactor biasing levels controlled by the output states of the sequencer 40 can be selected to correspond to 100 equally spaced frequencies within a desired tuning range, such as 70 to 140 megahertz, rather than the 100 equally spaced capacitance values discussed earlier.

(Although the illustrated apparatus only receives paging signals in the 88 to 108 megahertz band, the varactors must tune over a broader range, such as the 70 to 140 megahertz range cited, to account for different antenna loop lengths. For example, while a 21 centimeter watchband/antenna may be tuned over the desired 88 to 108 megahertz range by a first range of capacitance, this same range of capacitance will tune a 13 centimeter watchband/antenna over a markedly different frequency range. To account for all possible watchband/antenna lengths that may be used with a receiver, it is desirable that the varactors' tuning range be commensurately broad.)

As noted, the filtering section 20 of the apparatus 10 extracts the paging data from the other spectral components of the FM signal and passes this data to the digital processor 22. This data is modulated on an SCA subcarrier, the pilot of which is used as a clock in subsequent processing. The filtering section 20 includes a phase locked loop that locks to the pilot signal and thus requires a brief locking interval after power up. In the preferred form of the invention, this locking occurs simultaneously with the tuning of the antenna matching network. Although data cannot be decoded from the subcarrier until the antenna tuning operation is completed (due to the high signal to noise ratio required for accurate data decoding), the pilot has a high spectral power density and can usually be detected and locked to even before the antenna has been tuned. By performing these antenna tuning and locking operations simultaneously rather than sequentially, the receiver can be energized for shorter periods of time, thereby conserving battery power and extending battery life. The simultaneous tuning and locking also permits the receiver to dedicate more of its active time to the task of listening for messages and less to the task of readying the receiver.

Having described and illustrated the principles of our invention with reference to a preferred embodiment, it will be apparent that the invention can be modified in arrangement and detail without departing from such principles. For example, while the tuning control circuit has been shown as implemented with a certain collection of analog and digital components, alternative embodiments can readily be constructed using digital circuits in place of the illustrated analog circuits and vice versa. Similarly, while the invention has been described with reference to a paging receiver, it will be recognized that its utility is not so limited but rather extends to any receiving apparatus in which an antenna tuning function must be quickly and accurately performed.

In view of the wide range of embodiments and uses to which the principles of the present invention may be applied, it should be recognized that the apparatus described is to be considered illustrative only and not as limiting the scope of our invention. Rather, our invention is to include all such embodiments as may come within the scope and spirit of the following claims and equivalents thereof.

We claim:

1. A radio receiver which is periodically activated to receive a packet of information, comprising:
   an antenna connected to said receiver;
   an antenna tuning element coupled to said antenna for tuning said antenna;
   signal strength indicator means coupled to said antenna for producing a first signal which indicated the strength of a signal received by said radio receiver;
   tuning means coupled to the signal strength indicator means for sweeping said antenna tuning element through a predetermined range of values, for detecting when said first signal has a maximum and for setting said tuning element to the value that produces the maximum first signal value;
   means for automatically activating said tuning means when said radio receiver is activated and prior to the receipt of a packet of information;
   whereby said antenna is automatically tuned to the value that produces the maximum first signal prior to the time that said radio receiver receives a packet of information and whereby said receiver thereby reliably and accurately receives said packet of information.

2. A wristwatch paging receiver operative during recurrent time slots for receiving paging messages, comprising:
   an antenna for intercepting transmitted paging signals;
   an antenna tuning element coupled to the antenna for tuning the same;
   a receiver subsystem coupled to the antenna and the antenna tuning element for receiving a transmitted signal and for producing a feedback signal related to the received strength thereof;
   a tuning element controller having means for automatically tuning the antenna tuning element over an entire tuning range thereof once each time slot and for noting which tuning condition produces the maximum feedback signal, said controller further including means for returning the tuning element to said noted tuning condition for the remainder of the time slot; and
   a band for adapting the receiver to be worn on a user's body, said band further including at least a portion of the antenna.

3. The apparatus of claim 2 in which the tuning element controller comprises:
   a clock;
   a sequencer responsive to the clock for providing a sequence of binary output states;
   a digital to analog converter for converting the binary output states of the sequencer to analog signals; and
   means for controlling the tuning element with said analog signals.

4. A radio receiving apparatus comprising:
   an antenna for intercepting transmitted signals;
   an antenna tuning element coupled to the antenna for tuning the same;
   a receiver coupled to the antenna and the antenna tuning element for receiving a transmitted signal;
   feedback means for producing a feedback signal related to the strength of the received transmitted signal; and
   a tuning element controller having means for periodically and automatically retuning the antenna tuning element to maximize said feedback signal.

5. The apparatus of claim 4 in which the receiving apparatus further includes a wristband for adapting the apparatus to be worn on a user's body.

6. The apparatus of claim 5 in which the wristband includes at least a portion of the antenna.

7. The apparatus of claim 4 in which the receiver is operative during recurrent time slots for receiving a paging message and in which the tuning element includes means for automatically retuning the antenna tuning element at the beginning of each of said time slots.

8. The apparatus of claim 4 in which the tuning element controller comprises:
   a clock;
   a sequencer responsive to the clock for providing a sequence of binary output states;
   a digital to analog converter for converting the binary output states of the sequencer to analog signals; and
   means for controlling the tuning element with said analog signals.

9. The apparatus of claim 8 in which the sequence of binary output states provided by the sequencer corresponds to analog signals that vary non-uniformly from one state to the next.

10. In a method of operating a paging receiver in an area that has a radio signal that contains both paging data and a high power signal component that has a spectral power density higher than that of said paging data, said paging receiver including means for receiving said radio signal, said paging receiver including both a matching network for optimizing signal transfer between an antenna and the receiver, and a phase locked loop based demodulator circuit for extracting paging data from the signal, said matching network being operable during a tuning interval, an improvement comprising: phase locking the phase locked loop demodulator to said higher power signal component of said signal during said tuning interval.

11. A method of operating a receiver in a system, said receiver including timing means for dividing time into a series of recurrent time slots, and wherein said receiver is operative during recurrent time slots to receive a message modulated on a signal, the receiver including an antenna tuning circuit, an improvement comprising the step: retuning the antenna tuning circuit once each time slot during which said receiver is actuated to optimize reception of the paging signal.

12. The invention of claim 11 in which the retuning step further includes:
monitoring a signal from the receiver that is indicative of received signal strength;
automatically retuning the antenna tuning circuit over an entire tuning range thereof and noting which tuning condition produces the maximum received signal strength; and
retuning the tuning circuit to said noted tuning condition.

13. The invention of claim 12 in which the retuning step further includes tuning a tuning element in said tuning circuit by applying a sequence of non-uniformly incrementing discrete analog signals thereto.

14. The invention of claim 11 in which the paging receiver further includes a phase locked loop circuit for locking to a spectral component within the paging signal, and in which the method further includes the step:
phase locking the phase locked loop circuit to said spectral component while the antenna tuning circuit is being automatically retuned to optimize reception of the paging signal.

15. In an antenna matching/tuning network for a radio receiver that includes tuning means for tuning said receiver, a varactor diode and bias means for biasing the diode successively at a number of different bias levels during operation of said tuning means when the receiver is operating on a single frequency, an improvement comprising the step:
operating said bias means to bias said diode successively at a number of non-uniformly spaced bias levels.

16. The invention of claim 15 in which the non-uniformly spaced bias levels correspond to uniformly spaced varactor capacitances.

17. The invention of claim 15 in which the non-uniformly spaced bias levels correspond to uniformly spaced resonant frequencies of the matching network.

* * * * *